(12) United States Patent
Blatchford

(10) Patent No.: US 8,756,550 B2
(45) Date of Patent: Jun. 17, 2014

(54) METHOD TO ENSURE DOUBLE PATTERNING TECHNOLOGY COMPLIANCE IN STANDARD CELLS

(71) Applicant: Texas Instruments Incorporated, Dallas, TX (US)

(72) Inventor: James Walter Blatchford, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/622,935

(22) Filed: Sep. 19, 2012

(65) Prior Publication Data

US 2013/0074029 A1    Mar. 21, 2013

Related U.S. Application Data

(60) Provisional application No. 61/536,294, filed on Sep. 19, 2011.

(51) Int. Cl.
*G06F 17/50* (2006.01)

(52) U.S. Cl.
USPC ............... 716/118; 716/50; 716/51; 716/52; 716/53; 716/54; 716/55; 716/119; 716/126; 716/132; 716/136; 430/5; 430/30

(58) Field of Classification Search
USPC ............. 716/50–55, 118–120, 126, 132–133; 430/5, 30
See application file for complete search history.

(56) References Cited

U.S. PATENT DOCUMENTS

| | | | | |
|---|---|---|---|---|
| 8,063,415 B2 * | 11/2011 | Tsuda | | 257/207 |
| 8,136,072 B2 * | 3/2012 | Frederick | | 716/119 |
| 8,173,491 B2 * | 5/2012 | Law et al. | | 438/129 |
| 8,255,837 B2 * | 8/2012 | Lu et al. | | 716/50 |
| 8,513,978 B2 * | 8/2013 | Sherlekar | | 326/101 |

\* cited by examiner

*Primary Examiner* — Nghia Doan
(74) *Attorney, Agent, or Firm* — Wade J. Brady, III; Frederick J. Telecky, Jr.

(57) ABSTRACT

An integrated circuit with standard cells with top and bottom metal-1 and metal-2 power rails and with lateral standard cell borders that lie between an outermost vertical dummy poly lead from one standard cell and an adjacent standard cell. A DPT compatible standard cell design rule set. A method of forming an integrated circuit with standard cells constructed using a DPT compatible standard cell design rule set. A method of forming DPT compatible standard cells.

4 Claims, 5 Drawing Sheets

METHOD TO ENSURE DOUBLE PATTERNING TECHNOLOGY COMPLIANCE IN STANDARD CELLS

This application claims the benefit of priority and incorporates by reference U.S. Provisional Application 61/536,294, filed Sep. 19, 2011.

The following co-pending patent applications are related and hereby incorporated by reference: U.S. patent application Ser. No. 13/622,937, filed Sep. 19, 2012, and U.S. patent application Ser. No. 13/622,949, filed Sep. 19, 2012.

FIELD OF THE INVENTION

This invention relates to the field of integrated circuits. More particularly, this invention relates to double patterning photolithograph processes for forming integrated circuits.

BACKGROUND

Integrated circuits may be formed using photolithography processes with illumination sources having wavelengths more than twice a desired pitch of metal interconnect lines in the integrated circuits. Attaining desired tradeoffs between fabrication costs and fabrication yield may be difficult. For example, standard single photoresist patterns begin to blur at about the 45 nm feature size and 100 nm pitch (feature size plus space between features) when printing with 193 nm wavelength light.

Double patterning technology (DPT), illustrated in FIGS. 1, 2A, 2B, 3A and 3B may be used to print patterns with a pitch (minimum geometry size plus minimum space) that is tighter than can be printed with a single exposure. In DPT technology approximately one half the geometries of the interconnect pattern 20 shown in FIG. 1 are placed on a first double patterning photo mask shown in FIG. 2A and the remainder of the geometries are placed on a second double patterning photo mask shown in FIG. 2B. These photomasks are printed individually on the same level of interconnect to form an interconnect pattern with a much tighter pitch than either of the DPT photomasks. For example, a pattern with 100 nm pitch which prints blurred when all geometries are placed on a single photo mask may be decomposed into two DPT photo masks each with a 200 nm pitch which print without blurring.

Likewise the vial level 26 shown in FIG. 1 may be rendered DPT compatible by drawing approximately half the via geometries on one DPT via reticle as shown in FIG. 3A and drawing the remaining via geometries on a second DPT via reticle as shown in FIG. 3B.

Cell libraries of standard cells are commonly used in the design and layout of integrated circuits. For example, standard cells may be drawn for commonly used logic functions such as NAND and NOR gates or adders and placed in the cell library. Each time this logic function is required the standard cell may be retrieved from the cell library and placed in the circuit. This saves the time and cost of having to relay out the same pattern multiple times.

A problem arises when interconnect and via levels with tight pitch must be DPT compatible. Even though individual standard cells may be laid out to be DPT compatible as in FIG. 1, DPT conflicts may arise when the DPT clean standard cells are placed next to one another in an integrated circuit as is shown in FIG. 4. Four placements, 30, 32, 34, and 36, of the DPT clean cell (FIG. 1) show across cell boundary DPT design rule violations 38 and 40. Vias, 38, violate the same color via space design rule across the cell boundary, and metal-1 geometries 40 also violate the same color space design rule across the standard cell boundary.

A method for drawing DPT compatible standard cells that are free of across border DPT conflicts when placed adjacent to each other in an integrated circuit is desirable.

SUMMARY

An integrated circuit with standard cells with top and bottom metal-1 and metal-2 power rails and with lateral standard cell borders that lie between an outermost vertical dummy poly lead from one standard cell and an adjacent standard cell. A DPT compatible standard cell design rule set. A method of forming an integrated circuit with standard cells constructed using a DPT compatible standard cell design rule set. A method of forming DPT compatible standard cells.

DETAILED DESCRIPTION OF EXAMPLE EMBODIMENTS

Even though standard cells may be drawn with DPT compatible metal1 via1 and metal2 patterns, DPT conflicts may occur when the standard cells are placed adjacent to each other in an integrated circuit.

A set of DPT compatible standard cell design rules is given in Table 1. These design rules enable the development of standard cell libraries with DPT compatible standard cells that may be placed adjacent one another without incurring across cell border design rule violations.

Figure 1:
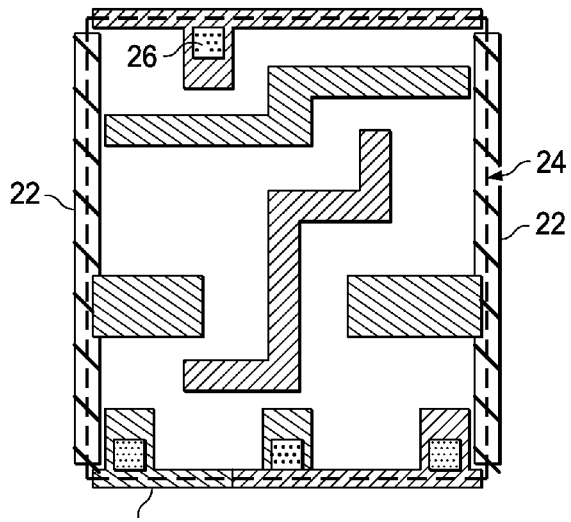
FIG. 1 (Prior art) shows a standard cell with DPT compliant metal-1 and via-1 patterns FIGS. 2A and 2B (Prior Art) show first and second DPT metal-1 patterns for standard cell of FIG. 1.
Figure 2A:
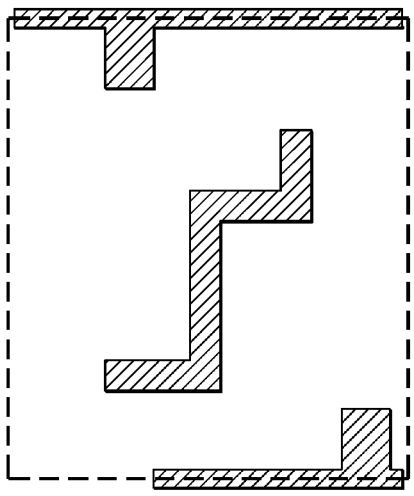
Figure 2B:
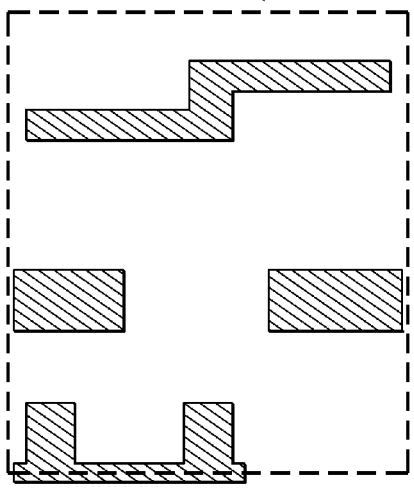
Figure 3A:
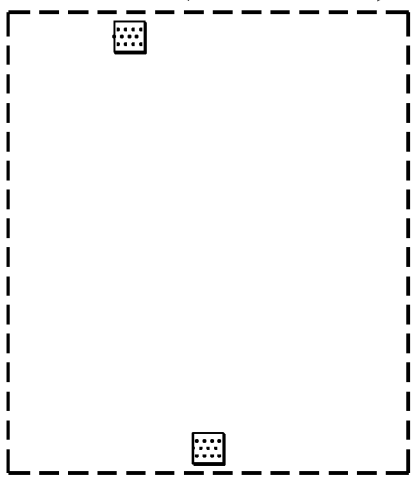
FIGS. 3A and 3B (Prior Art) show first and second DPT via-1 patterns for standard cell of FIG. 1.
Figure 3B:
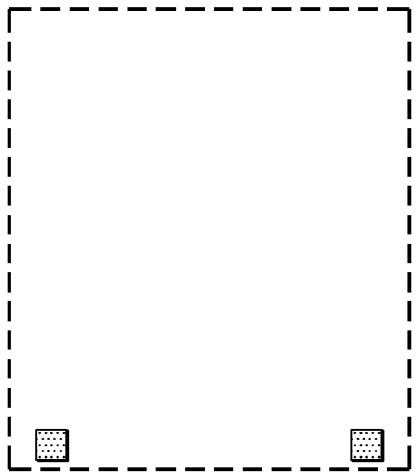
Figure 4:
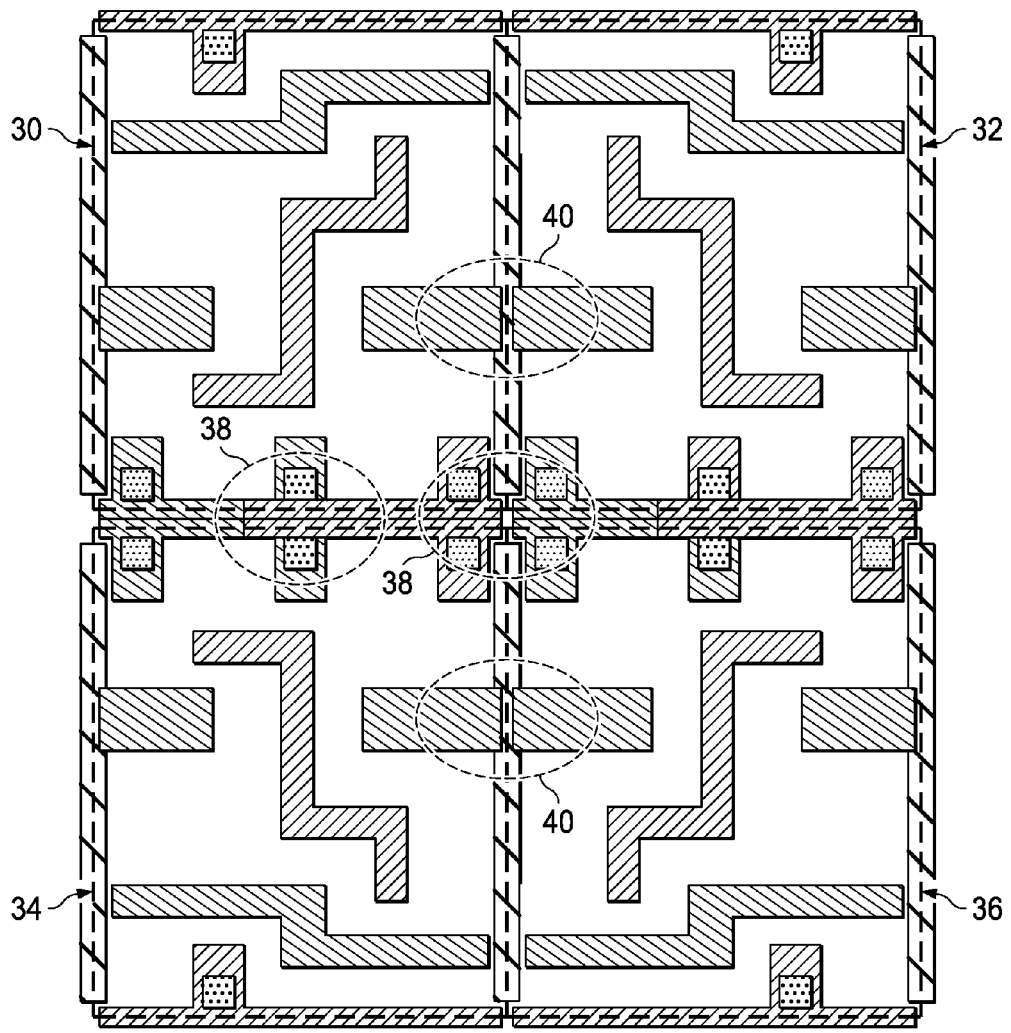
FIG. 4 (Prior Art) shows four placements of standard cell of FIG. 1 showing across cell boundary design rule conflicts.
Figure 5:
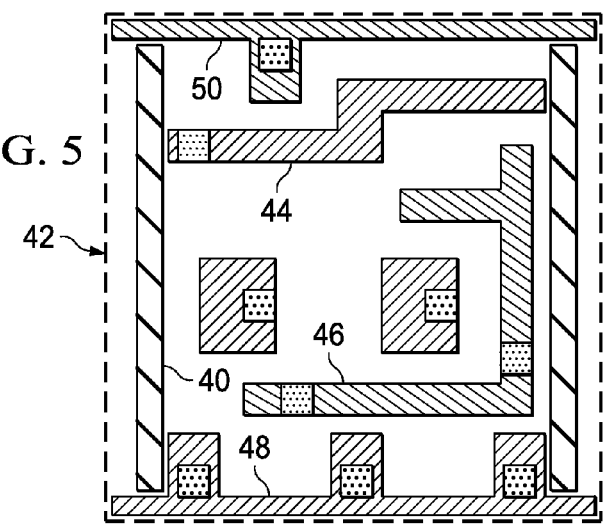
FIG. 5 shows the metal-1 and via-1 patterns of a standard cell formed according to principles of the invention.
Figure 8:
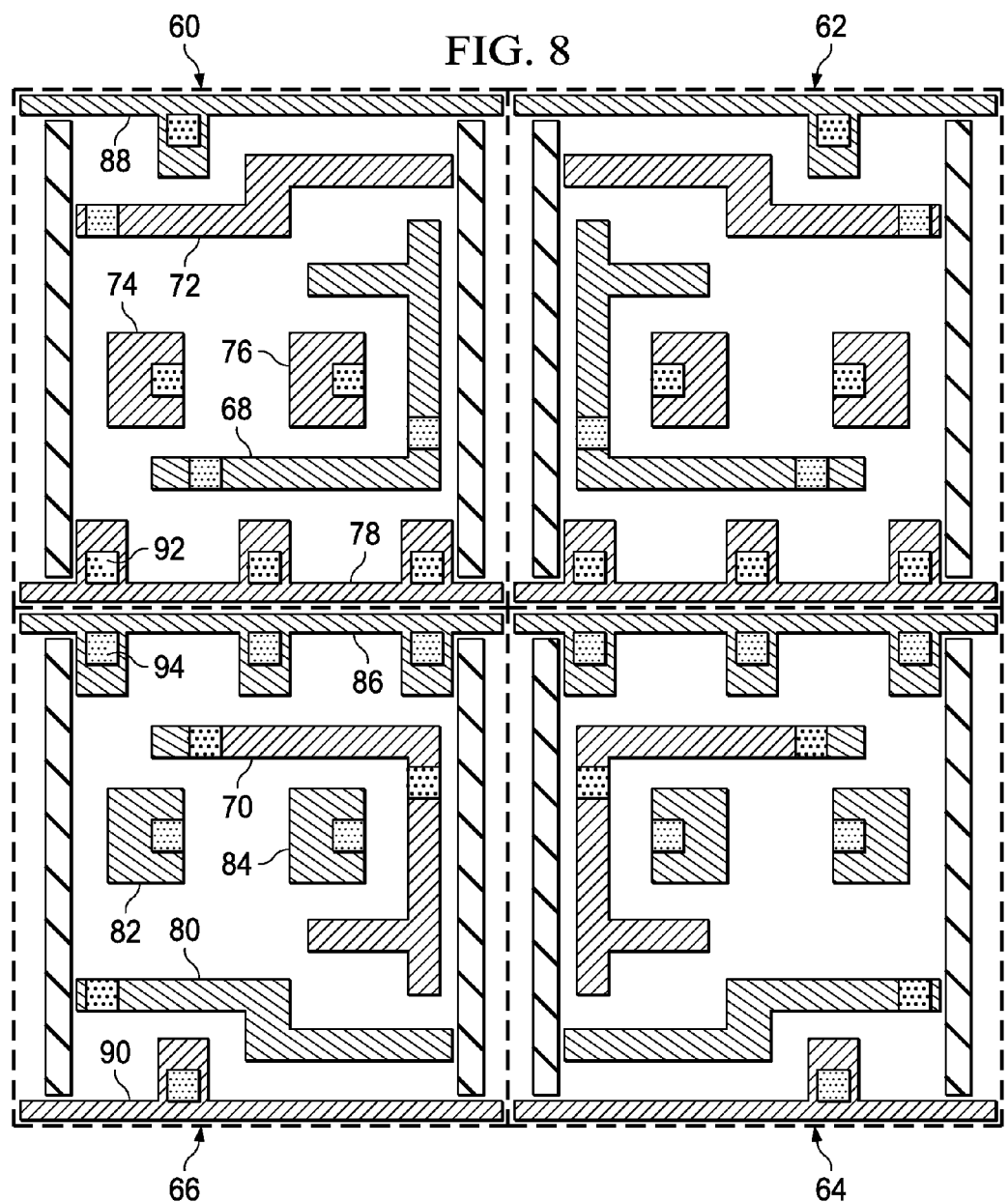
FIG. 8 shows four placements of the standard cell of FIG. 5 formed according to principles of the invention showing no across cell boundary design rule conflicts.

Unlike the typical standard cell shown in FIG. 1 where the cell boundary 24 runs down the middle of the outer most dummy poly geometry 24, the cell boundary 42 in the embodiment standard cell in FIG. 5 is drawn in a space outside the outermost dummy poly geometry 40. The boundary in the embodiment standard cell follows embodiment DPT compatible standard cell design rule #3 in Table 1. This design rule results in two dummy poly features at cell boundaries during place and route as shown in FIG. 8 instead of a single dummy poly feature between standard cells for typical standard cells as shown in FIG. 4. Although the double dummy poly geometries may make the footprint of the poly geometries in a standard cell slightly larger, typically the area of a standard cell is not limited by active or poly but is limited by the interconnect layers during place and route. The two dummy poly rule facilitates placement of standard cells with out incurring across border design rule violations.

As shown in FIG. 5, according to embodiment DPT compatible standard cell design rule 1, a first power rail 50 is drawn across the width of the standard cell touching the cell boundary 42 at the top and sides of the standard cell and a second power rail 48 is drawn across the width of the standard cell touching the cell boundary 42 at the bottom and sides of the standard cell.

In accordance with embodiment DPT compatible standard cell design rule 4 all metal-1 standard cell geometries 44 and 46, other than the power rails stop within a design rule distance of the dummy poly 40 or the standard cell boundary 42. This ensures no across border design rule conflicts occur during place and route.

In accordance with embodiment DPT compatible standard cell design rule 2, each power rail is comprised of one color.

TABLE 1

| RULE | DESCRIPTION |
| --- | --- |
| 1 | Draw unidirectional power rails in Metal-1 and Metal-2 at the top and bottom of standard cells that are one color, and extend to the cell top or bottom boundary extend to the side cell boundaries. |
| 2 | Each power rail is one color. Adjacent power rails may be the same or different color. |
| 3 | The sides of the standard cell are terminated in a space outside a dummy poly feature |
| 4 | With the exception of the power rails at the top and bottom of the standard cell, drawing of Metal1, Via1, and Metal2 geometries are restriced to within a fixed design rule distance of the dummy poly or the cell side boundary. |
| 5 | During place and route, the color of geometries in the standard cell may be reversed to eliminate across standard cell border design rule conflicts. |

Figure 6A:
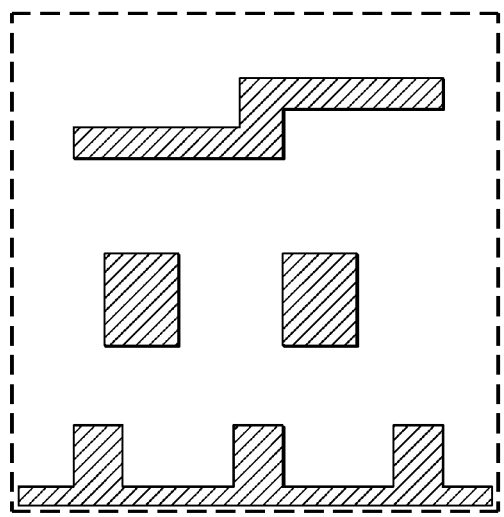
FIGS. 6A and 6B show first and second DPT metal-1 patterns for standard cell of FIG. 5 formed according to principles of the invention.
Figure 6B:
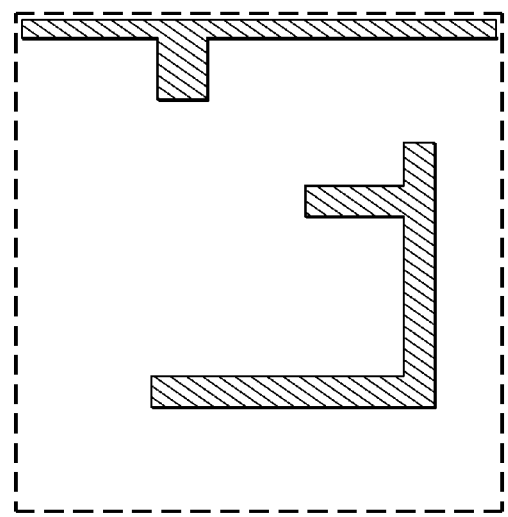

As shown in FIGS. 6A and 6B, the metal-1 layer is DPT compatible and may be decomposed into first (FIG. 6A) and second (FIG. 6B) DPT patterns.

Figure 7A:
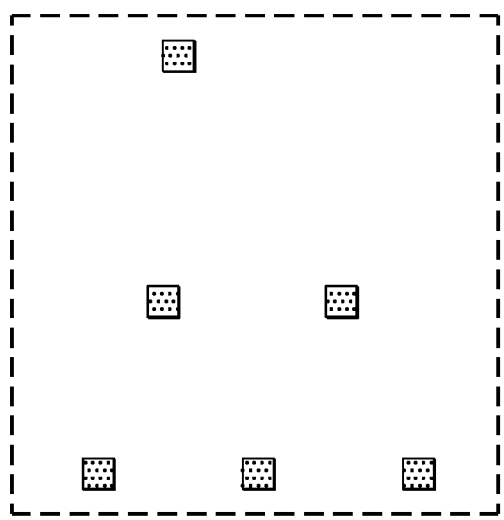
FIGS. 7A and 7B show first and second DPT via-1 patterns for standard cell of FIG. 5 formed according to principles of the invention.
Figure 7B:
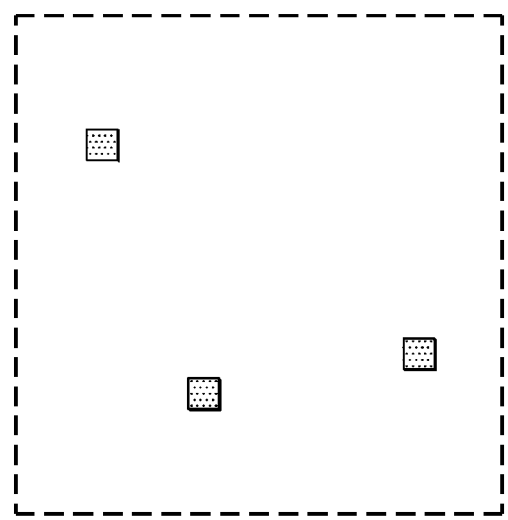

As shown in FIGS. 7A and 7B, the via-1 pattern is drawn to be DPT compatible and may be decomposed into first (FIG. 7A) and second (FIG. 7B) DPT patterns.

In FIG. 8 the example standard cell formed according to embodiments is placed 4 times, 60, 62, 64, and 66. In accordance with embodiment DPT compatible STD cell design rule 5, the color of geometries 72, 74, 76, and 78 in standard cell 60 are changed from first color to second color geometries 80, 82, 84, and 86 in standard cell 66. Likewise, standard cell metal-1 geometries 68 and 88 are changed from second color in standard cell 60 to first color geometries 70 and 90 in standard cell 66. Via-1 geometries 92 in standard cell 60 are changed from first color to second color via geometries 94 in standard cell 66. Without the change in color, vias 92 and 94 would violate the same color via space design rule across the standard cell border. Since they have been changed to different colors the tighter different color via space design rule may be used without an across standard cell border design rule violation.

Figure 9:
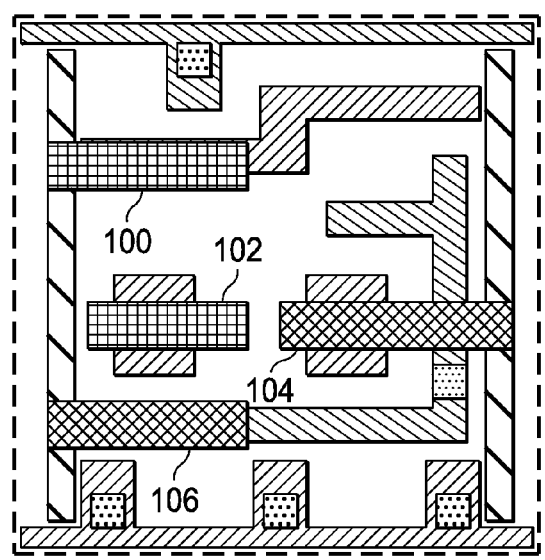
FIG. 9 shows the metal-1 and metal-2 patterns of a standard cell formed according to principles of the invention.

FIG. 9 shows the embodiment DPT compatible standard cell in FIG. 5 with metal-2 geometries interior to the standard cell drawn in using the DPT compatible standard cell design rules in Table 1. The top and bottom power rails according to DPT compatible design rule #1 may be drawn manually or optionally may be drawn by an autorouter during place and route.

Figure 10:
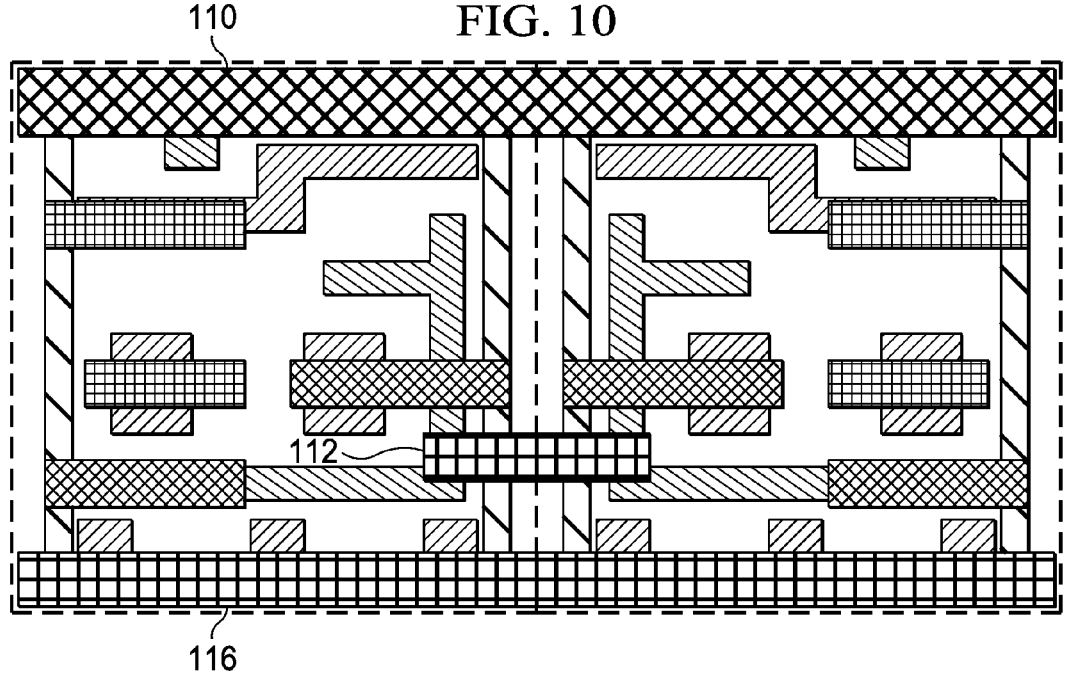
FIG. 10 shows a standard cell having metal-2 patterns that cross the boundary of the standard cell formed according to principles of the invention.

FIG. 10 shows the example standard cell after place and route in which metal-2 geometries are drawn following the embodiment DPT compatible standard cell design rules in TABLE 1. In this embodiment example, DPT compatible metal-2 geometries, 100, 102, 104, and 106, interior to the standard cell are drawn manually. Geometries 100 and 102 are drawn using a first color and geometries 104 and 106 are drawn using a second color. According to DPT compatible standard cell design rule 4 in table 1 these geometries stop a fixed design rule distance from the outermost dummy poly or the standard cell boundary. In this example embodiment, a DPT compatible auto router draws metal-2 leads such as the power rails 110 and 116, and metal-2 lead 112 that cross the boundary of the standard cell.

As shown in FIG. 10, power rail geometry 110 is drawn by the DPT compatible autorouter (such as is described in US patent application Ser. No. 13/622,937 incorporated for reference) using the same color as interior geometries 104 and 106. Power rail geometry 116 and cross cell boundary metal-2 interconnect geometry 112 are drawn by the DPT compatible autorouter using the same color as interior geometries, 100 and 102.

Interconnect and via levels from metal-3 on up may be drawn using an auto router with DPT restrictions to complete the integrated circuit.

In the above illustrative embodiment, the metal-1, and a via-1 geometries are manually drawn according to the DPT compatible standard cell design rules and metal-2 is mix of manual drawn and auto router drawn geometries. Different combinations of manual and DPT compatible autorouting may be employed using the embodiment standard cell DPT compatible design rules of TABLE 1 to form a library of standard cells that may be placed without generating across cell boundary design rule violations.

Those skilled in the art to which this invention relates will appreciate that many other embodiments and variations are possible within the scope of the claimed invention.

What is claimed is:

1. A method of forming an integrated circuit, comprising the steps:

forming a first metal-1 pattern of a metal-1 interconnect layer of a double pattern technology (DPT) process over said integrated circuit, said first metal-1 pattern including first geometries of a first standard cell and first geometries of a second standard cell laterally adjacent to said first standard cell;

forming a second metal-1 pattern of said metal-1 interconnect layer of said DPT process over said integrated circuit, said second metal-1 pattern including second geometries of said first standard cell and second geometries of said second standard cell;

forming a first metal-2 pattern of a metal-2 interconnect layer over said metal-1 interconnect layer of said DPT process over said integrated circuit, said first metal-2 pattern including first geometries of said first standard cell and first geometries of said second standard cell abutting said first standard cell; and forming a second metal-2 pattern of said metal-2 interconnect layer of said DPT process over said integrated circuit, said second metal-2 pattern including second geometries of said first standard cell and second geometries of said second standard cell;

wherein each of said first standard cell and said second standard cell;

have cell side boundaries which lie outside an outermost vertical dummy poly lead;

have a first metal-1 power rail across a top of said standard cells where said first metal-1 power rail traverses a width of each of said standard cells and touches a top boundary and said cell side boundaries;

have a second metal-1 power rail across a bottom of said standard cells where said second metal-1 power rail traverses said width of each of said standard cells and touches a bottom boundary and said cell side boundaries;

have DPT compatible metal-1 geometries in an interior of said standard cells where said metal-1 geometries terminate a design rule distance from said outermost vertical dummy poly lead or terminate a design rule distance from said cell side boundary;

have a first metal-2 power rail across said top of said standard cells where said first metal-2 power rail traverses said width of each of said standard cells and touches said top boundary and said cell side boundaries;

have a second metal-2 power rail across said bottom of said standard cells where said second metal-2 power rail traverses said width of each of said standard cells and touches a bottom boundary and said cell side boundaries; and have DPT compatible metal-2 geometries in said interior of said standard cells where said metal-2 geometries terminate a design rule distance from said outermost vertical dummy poly lead or terminate a design rule distance from said cell side boundaries; and where said cell side boundary of said first standard cell lies between a first outermost vertical dummy poly lead of said first standard cell and a second outermost vertical dummy poly lead of said second standard cell;

where said first metal-1 power rail across said top of said first standard cell is continuous with said first metal-1 power rail across said top of said second standard cell;

where said first metal-1 power rail across said bottom of said first standard cell is continuous with said first metal-1 power rail across said bottom of said second standard cell;

where said first metal-2 power rail across said top of said first standard cell is continuous with said first metal-2 power rail across said top of said second standard cell; and where said first metal-2 power rail across said bottom of said first standard cell is continuous with said first metal-2 power rail across said bottom of said second standard cell.

2. The method of claim 1 where said metal-1 top and bottom power rails and said metal-1 geometries are manually drawn and where said metal-2 top and bottom power rails and said metal-2 geometries are manually drawn.

3. The method of claim 1 where said metal-1 top and bottom power rails and said metal-1 geometries are drawn manually and where a first portion of said metal-2 geometries are manually drawn and where a second portion of said metal-2 geometries and said metal-2 top and bottom power rails are drawn by a DPT compatible autorouter.

4. The method of claim 1 further comprising:
placing a third standard cell below said first standard cell;
where a top or bottom power rail of said third standard cell touches said bottom power rail of said first standard cell;
checking for an across boundary DPT design rule conflict;
when said DPT design rule conflict occurs, changing a color of each metal-1, via-1, and metal-2 geometry in said third standard cell.

* * * * *